United States Patent
Kawamura et al.

(10) Patent No.: US 8,105,453 B2
(45) Date of Patent: *Jan. 31, 2012

(54) METHOD FOR PRODUCING MULTILAYER CERAMIC SUBSTRATE

(75) Inventors: Akiyoshi Kawamura, Nagaokakyo (JP); Takayuki Tsukizawa, Kusatsu (JP); Tetsuya Ikeda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/029,545

(22) Filed: Feb. 12, 2008

(65) Prior Publication Data

US 2008/0135155 A1 Jun. 12, 2008

Related U.S. Application Data

(63) Continuation of application No. PCT/JP2007/059612, filed on May 9, 2007.

(30) Foreign Application Priority Data

May 29, 2006 (JP) ................. 2006-148246

(51) Int. Cl.
*C03B 29/00* (2006.01)
*B32B 13/04* (2006.01)
*B32B 3/14* (2006.01)

(52) U.S. Cl. ............... 156/89.11; 156/89.12; 428/49; 428/446

(58) Field of Classification Search ............. 156/89.11, 156/89.12; 29/830; 117/98; 428/446, 49
See application file for complete search history.

(56) References Cited

U.S. PATENT DOCUMENTS

| | | | | |
|---|---|---|---|---|
| 4,353,957 | A | * | 10/1982 | Rutt et al. ............. 428/110 |
| 5,604,328 | A | * | 2/1997 | Kubota et al. ........... 174/524 |
| 6,938,332 | B2 | * | 9/2005 | Harada et al. ............ 29/830 |
| 7,833,370 | B2 | * | 11/2010 | Kawamura et al. ...... 156/89.11 |
| 2002/0034614 | A1 | * | 3/2002 | Kawakami et al. ....... 428/195 |
| 2002/0098330 | A1 | * | 7/2002 | Masuko .................. 428/209 |
| 2003/0000079 | A1 | * | 1/2003 | Harada et al. ............ 29/830 |

(Continued)

FOREIGN PATENT DOCUMENTS

JP 4-38071 U 3/1992

(Continued)

OTHER PUBLICATIONS

Yang et al., "Effects of moisture on the glass transition temperature of polyurethane shape memory polymer filled with nano-carbon powder," Dec. 30, 2004, European Polymer Journal 41, (2005), pp. 1123-1128.*

(Continued)

Primary Examiner — Philip Tucker
Assistant Examiner — Alex Efta
(74) Attorney, Agent, or Firm — Keating & Bennett, LLP

(57) ABSTRACT

In a method for producing a multilayer ceramic substrate, a green ceramic laminate includes green conductive patterns arranged on a plurality of ceramic green sheets and portions to be formed into a plurality of multilayer ceramic substrates. Boundary-defining conductive patterns are arranged on the ceramic green sheets and along boundaries of the multilayer ceramic substrates. The boundary-defining conductive patterns have firing shrinkage characteristics that are different from those of the ceramic green sheets. During firing of the green ceramic laminate, cavities adjacent to edges of the boundary-defining conductive patterns are formed. A sintered ceramic laminate is divided at edges passing through the cavities.

10 Claims, 5 Drawing Sheets

U.S. PATENT DOCUMENTS

2005/0088803 A1 * 4/2005 Umeda et al. .............. 361/321.2
2006/0234021 A1 10/2006 Tanei et al.

FOREIGN PATENT DOCUMENTS

| JP | 5-75262 A | | 3/1993 |
| JP | 06085460 A | * | 3/1994 |
| JP | 2001-44599 A | | 2/2001 |
| JP | 2001-332857 A | | 11/2001 |
| JP | 2002-16359 A | | 1/2002 |
| JP | 2002016359 A | * | 1/2002 |
| JP | 2002-270459 A | | 9/2002 |
| JP | 2002270459 A | * | 9/2002 |
| JP | 2005-150669 A | | 6/2005 |
| JP | 2005-229135 A | | 8/2005 |
| JP | 2005-277008 A | | 10/2005 |

OTHER PUBLICATIONS

Official communication issued in the International Application No. PCT/JP2007/059612, mailed on Aug. 14, 2007.
Official communication issued in counterpart European Application No. 07743047.8, mailed on Apr. 20, 2009.
Official Communication issued in corresponding Japanese Patent Application No. 2007-556188, mailed on Aug. 11, 2010.
Official Communication issued in corresponding Japanese Patent Application No. 2007-556188, mailed on Mar. 23, 2011.

* cited by examiner

METHOD FOR PRODUCING MULTILAYER CERAMIC SUBSTRATE

BACKGROUND OF THE INVENTION

1. Field of the Invention

The present invention relates to a method for producing a multilayer ceramic substrate. In particular, the present invention relates to a method for producing a multilayer ceramic substrate including a plurality of stacked ceramic layers.

2. Description of the Related Art

Multilayer ceramic substrates including a plurality of stacked ceramic layers can be efficiently produced by simultaneously firing a source substrate including a plurality of multilayer ceramic substrates and cutting the source substrate into individual multilayer ceramic substrates after firing.

For example, Japanese Unexamined Utility Model Registration Application Publication No. 4-38071 discloses that ceramic green sheets having dividing lines are transferred and laminated to form a laminate, dividing grooves are formed by, for example, irradiating the dividing lines with a $CO_2$ laser after the laminate is subjected to heat treatment, and the laminate is separated into many substrates.

Japanese Unexamined Patent Application Publication No. 5-75262 discloses that dividing grooves are formed in advance in either or both of front and back surfaces of press-bonded ceramic green sheets, and the resulting substrate is bent to form cracks along the dividing grooves after heat treatment, thereby separating the substrate into many substrates.

In Japanese Unexamined Utility Model Registration Application Publication No. 4-38071, however, an expensive, large-scale $CO_2$ laser irradiation apparatus is required. The laser irradiation requires a long time. During cutting, the substrates may be broken by thermal strain, and deformation and/or alteration due to the heat of the laser may occur in sections of the substrate.

In the method disclosed in Japanese Unexamined Patent Application Publication No. 5-75262, in the press-bonded sheets after the formation of the dividing grooves, failures, such as deformation and breakage, may occur due to the dividing grooves during handling of the press-bonded sheets. When the heat-treated substrate is bent, the substrate may be broken at undesirable locations other than the grooves, resulting in defective articles. Although the substrate is separated along the dividing grooves, edges may have irregular shapes, resulting in out-of-specification products.

SUMMARY OF THE INVENTION

To overcome the problems described above, preferred embodiments of the present invention provide a source substrate for forming multilayer ceramic substrates and a method for accurately and easily producing a multilayer ceramic substrate.

A preferred embodiment of the present invention provides a method for producing a multilayer ceramic substrate as described below.

A method for producing a multilayer ceramic substrate includes (1) a first step of forming a green ceramic laminate including a plurality of stacked green ceramic layers, (2) a second step of firing the green ceramic laminate to sinter the green ceramic layers, and (3) a third step of dividing the sintered ceramic laminate formed by firing the green ceramic laminate into a plurality of pieces. The green ceramic laminate formed in the first step includes at least one green boundary-defining thick-film pattern arranged on one main surface of at least one of the green ceramic layers and along a portion corresponding to the boundary between the pieces of the sintered ceramic laminate divided in the third step, the at least one green boundary-defining thick-film pattern having firing characteristics that are different from those of the green ceramic layers adjacent to the at least one green boundary-defining thick-film pattern. In the second step, a cavity is formed due to the difference in firing shrinkage characteristics between the at least one boundary-defining thick-film pattern and the ceramic layers in contact with the at least one boundary-defining thick-film pattern, the cavity being adjacent to at least a portion of an outer edge of the at least one boundary-defining thick-film pattern when viewed in the stacking direction of the ceramic layers. In the third step, the sintered ceramic laminate is divided along the cavity into the plurality of pieces.

According to the above-described method, in the sintered ceramic laminate, the cavity is formed at a side of the sintered boundary-defining thick-film pattern due to the difference in firing shrinkage characteristics, such as a firing shrinkage initiation temperature, a firing shrinkage termination temperature, and a firing shrinkage rate between the ceramic layer and boundary-defining thick-film pattern. The sintered ceramic laminate can be divided into the pieces separated through the cavity. Each of the pieces formed by dividing the sintered ceramic laminate may be an individual piece divided according to a final product. Alternatively, each of the pieces may be an intermediate product including a plurality of sub-pieces to be further divided in the downstream process. The green ceramic layers may be ceramic green sheets made by forming a ceramic powder into sheets. Alternatively, the green ceramic layers may be thick-film printed layers made by forming a paste including a ceramic powder into layers by printing.

According to a preferred embodiment, the firing shrinkage initiation temperature of the at least one green boundary-defining thick-film pattern is less than that of the green ceramic layers in contact with the boundary-defining thick-film pattern.

In this case, in the second step, as the firing temperature increases, the boundary-defining thick-film pattern begins to shrink earlier than the ceramic layers around the pattern. Thus, the cavity is formed at a side of the boundary-defining thick-film pattern.

According to another preferred embodiment, the firing shrinkage rate of the at least one green boundary-defining thick-film pattern is greater than that of the ceramic layers in contact with the at least one boundary-defining thick-film pattern.

In this case, the firing shrinkage rate of the boundary-defining thick-film pattern is greater than that of the ceramic layers around the pattern during firing in the second step. Thus, the cavity is formed at a side of the boundary-defining thick-film pattern.

Preferably, the at least one boundary-defining thick-film pattern includes a plurality of boundary-defining thick-film patterns, wherein the boundary-defining thick-film patterns are arranged at different interfaces among the green ceramic layers, and at least a portion of an outer edge of each of the boundary-defining thick-film patterns is arranged in a common imaginary plane extending in the stacking direction of the green ceramic layers.

In this case, the common imaginary plane of a plurality of cavities extending in the stacking direction is defined as a boundary, and the sintered ceramic laminate can be divided at the boundary. The plurality of the boundary-defining thick-film patterns may be arranged on either or both sides of the common imaginary plane.

Preferably, the first step includes a substep of bringing a green shrinkage inhibiting layer that is not substantially sintered at a firing temperature of the green ceramic layers into close contact with at least one main surface of the green ceramic laminate. In the second step, the green ceramic laminate in close contact with the shrinkage inhibiting layer is fired at a temperature from a sintering temperature of the ceramic layers to a temperature at which the shrinkage inhibiting layer is not substantially sintered. The method further includes a step of removing the shrinkage inhibiting layer in close contact with the sintered ceramic laminate between the second step and the third step.

In this case, the firing shrinkage of the green ceramic laminate is inhibited by the shrinkage inhibiting layer in the direction perpendicular to the stacking direction (i.e., a main surface direction). The green ceramic laminate shrinks significantly in the thickness direction, thereby easily forming the cavity at a side of the boundary-defining thick-film pattern.

Preferably, the at least one green boundary-defining thick-film pattern is a green boundary-defining conductive pattern including a conductive material.

Preferably, the sintered ceramic laminate includes an internal circuit conductive pattern defining an embedded element arranged between the ceramic layers. Preferably, the internal circuit conductive pattern is electrically separated from the boundary-defining conductive pattern.

In this case, the internal circuit conductive pattern defines the embedded element, such as a capacitor, an inductor, a lead, or a ground, after firing. The internal circuit conductive pattern and the boundary-defining conductive pattern are electrically independent of each other. Thus, different materials may be used therefor. That is, the boundary-defining conductive pattern may be composed of a material that forms the cavity adjacent to an outer edge of the boundary-defining conductive pattern. The internal circuit conductive pattern may be composed of a material that does not form the cavity adjacent to an outer edge of the internal circuit conductive pattern (embedded element). Thus, the choice of materials used for the internal circuit conductive pattern and the boundary-defining conductive pattern is not particularly limited.

Preferably, at least a portion of the boundary-defining conductive pattern defines an embedded element arranged between the ceramic layers of the sintered ceramic laminate.

In this case, the boundary-defining conductive pattern can also function as at least a portion of the internal circuit conductive pattern defining the embedded element. The boundary-defining conductive pattern and the internal circuit conductive pattern can be composed of the same material, thus simplifying the process. Furthermore, the boundary-defining conductive pattern and the internal circuit conductive pattern can be arranged with no space therebetween, thus resulting in a reduction in the size of the multilayer ceramic substrate. Moreover, the embedded element can be electrically connected to the outside with the boundary-defining conductive pattern exposed at edges of the sintered ceramic laminate.

Preferably, the method further includes a step of mounting a surface-mounted electronic component on the sintered ceramic laminate before or after the sintered ceramic laminate is divided into the plurality of pieces.

Another preferred embodiment of the present invention provides a source substrate of multilayer ceramic substrates.

A source substrate for multilayer ceramic substrates includes a plurality of ceramic layers bonded to each other, a conductive pattern arranged at least one interface between the ceramic layers, and portions to be formed into a plurality of multilayer ceramic substrates. When the source substrate is viewed in the stacking direction of the ceramic layers, a cavity is formed at a boundary of the multilayer ceramic substrates, the cavity being adjacent to at least a portion of an outer edge of the conductive pattern.

According to the structure, the source substrate can be divided into pieces including one or more multilayer ceramic substrates separated through the cavity.

According to preferred embodiments of the present invention, the sintered laminate is divided by utilizing the cavity formed due to the difference in firing shrinkage characteristics between the green ceramic layers and the green boundary-defining thick-film pattern. Thus, the multilayer ceramic substrate can be produced accurately and easily.

That is, edges of the sintered ceramic laminate pass through the cavity, thereby preventing misalignment and variations in the shape of the multilayer ceramic substrates. This also prevents separation at an undesirable location, breakage during cutting, or variations among the break edges.

Furthermore, a thick-film pattern may be simply formed at a desirable location of the green ceramic laminate as well as a conductive pattern. The cavity is formed by firing. Thus, deformation and breakage are not caused by the cavity during the conveyance of the green multilayer ceramic substrate. The sintered ceramic laminate can be easily cut by applying a stress to the cavity. Thus, an expensive, large-scale $CO_2$ laser irradiation apparatus is not required. The application of heat is not required during cutting, thereby preventing the deformation and alteration caused by heat at and in the vicinity of the break edges.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described below with reference to FIGS. 1A to 7D.

First Preferred Embodiment

A method for producing a multilayer ceramic substrate according to a first preferred embodiment will be described below with reference to FIGS. 1A to 4.

A brief outline of the method for producing a multilayer ceramic substrate will be described below with reference to FIGS. 1A to 1C which are cross-sectional views.

Figure 1A:
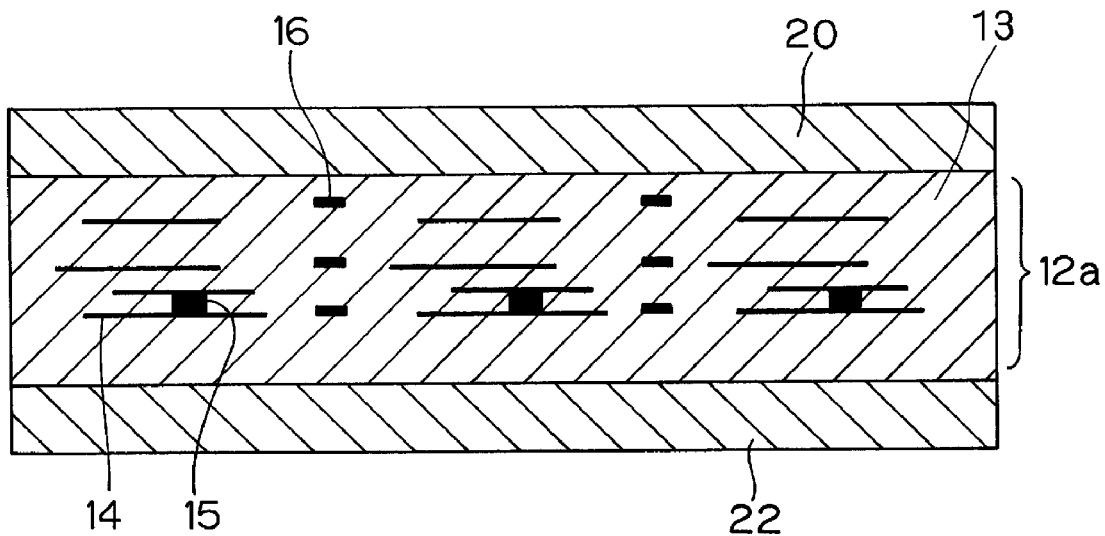
FIGS. 1A to 1C are cross-sectional views illustrating a production process of multilayer ceramic substrates according to a preferred embodiment of the present invention.

As shown in FIG. 1A, shrinkage inhibiting green sheets 20 and 22 in close contact with both surfaces of a green ceramic laminate 12a including portions to be formed into a plurality of multilayer ceramic substrates are fired.

Figure 2:
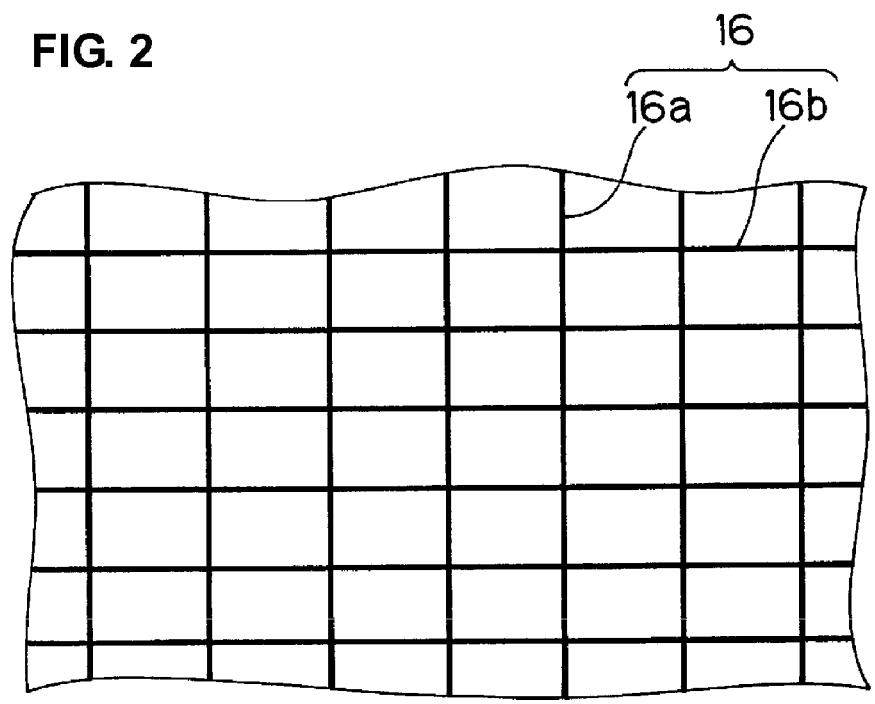
FIG. 2 is a plan view of a boundary-defining conductive pattern according to the preferred embodiment shown in FIG. 1.

The green ceramic laminate 12a includes in-plane conductive patterns 14 to be formed into internal electrodes, internal leads, embedded elements, and other circuit components in the multilayer ceramic substrates, the in-plane conductive patterns 14 being arranged between a plurality of stacked ceramic green sheets 13; and boundary-defining conductive patterns 16 arranged along boundaries between the multilayer ceramic substrates. As shown in FIG. 2 which is a plan view in the stacking direction of the ceramic green sheets 13, the boundary-defining conductive patterns 16 each include segments 16a extending longitudinally and segments 16b extending laterally, the segments 16a and 16b being arranged along boundaries of the portions to be formed into the multilayer ceramic substrates arranged in a matrix.

Figure 1B:
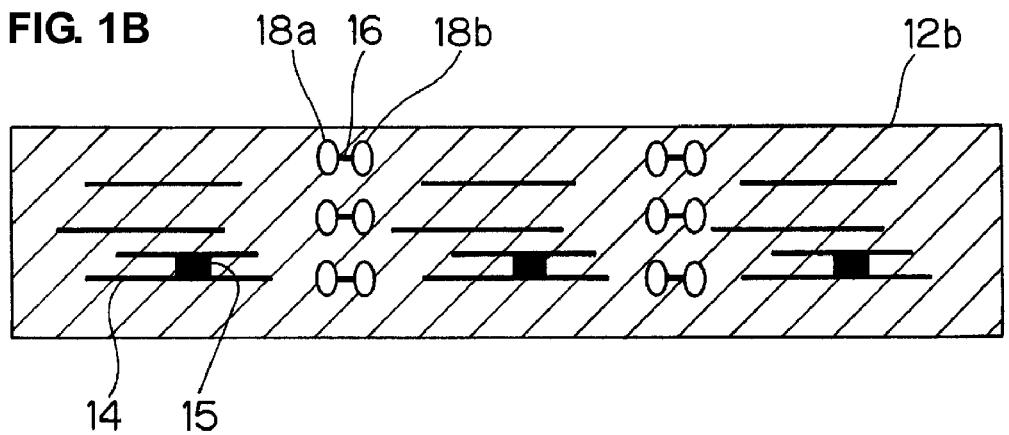

As shown in FIGS. 1A and 1B, conductive via patterns 15 passing through the ceramic green sheets 13 and connected to the in-plane conductive patterns 14 are formed in the ceramic green sheets 13.

The shrinkage behavior of the ceramic green sheets 13 and the shrinkage behavior of the in-plane conductive patterns 14 are adjusted such that a cavity is not formed between the ceramic layers during firing. The boundary-defining conductive patterns 16 are preferably composed of a material having sintering characteristics that are significantly different from the sintering characteristics of the ceramic green sheets 13. The boundary-defining thick-film patterns are preferably conductive patterns primarily composed of a conductive material, such as Ag or Cu. Alternatively, the boundary-defining thick-film patterns may be insulating patterns primarily composed of an insulating material, such as a ceramic material or glass.

As schematically shown in FIG. 1B, cavities 18a and 18b are formed along edges of each boundary-defining conductive pattern 16 in a fired ceramic laminate 12b. That is, the ceramic layers that sandwich the boundary-defining conductive patterns 16 shrink in the vicinity of the outer edges of the boundary-defining conductive patterns 16 due to the contact with the boundary-defining conductive patterns 16. Thereby, the cavities 18a and 18b are formed between the ceramic layers. FIG. 1B shows a state after the removal of the shrinkage inhibiting layers.

For example, the boundary-defining conductive patterns 16 are formed of an Ag paste having a shrinkage rate greater than that of the ceramic green sheets 13 during sintering. In this case, the amount of shrinkage of each boundary-defining conductive pattern 16 is greater than that of the ceramic green sheets arranged around the pattern 16. Thus, the cavities 18a and 18b are formed at the edges of each boundary-defining conductive pattern 16.

Alternatively, the boundary-defining conductive patterns 16 are formed of an Ag paste having a sintering initiation temperature that is less than that of each ceramic green sheet 13. In this case, the boundary-defining conductive patterns 16 begin to shrink earlier than the ceramic green sheets around the patterns 16. Thus, the cavities 18a and 18b are formed at the edges of each boundary-defining conductive pattern 16.

Figure 1C:
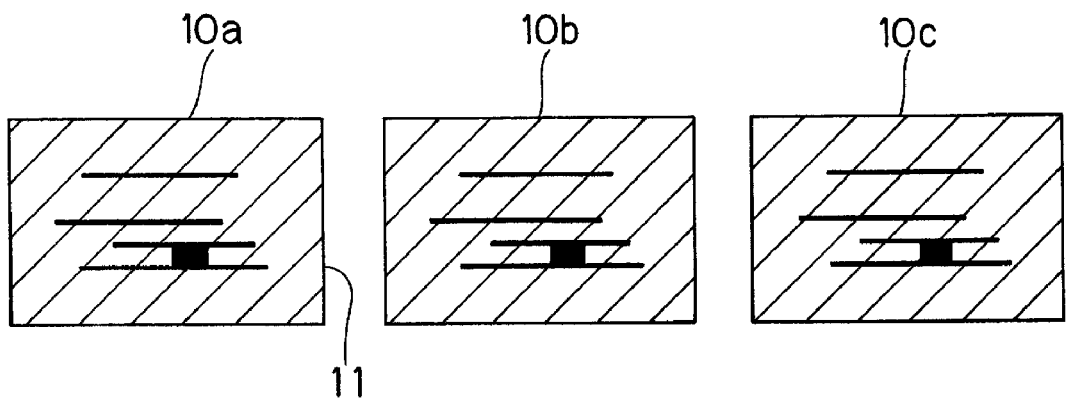

The fired ceramic laminate 12b can be divided by bending into pieces 10a, 10b, and 10c, to be formed into the multilayer ceramic substrates, separated through the cavities 18a and 18b as schematically shown in FIG. 1C.

Figure 3:
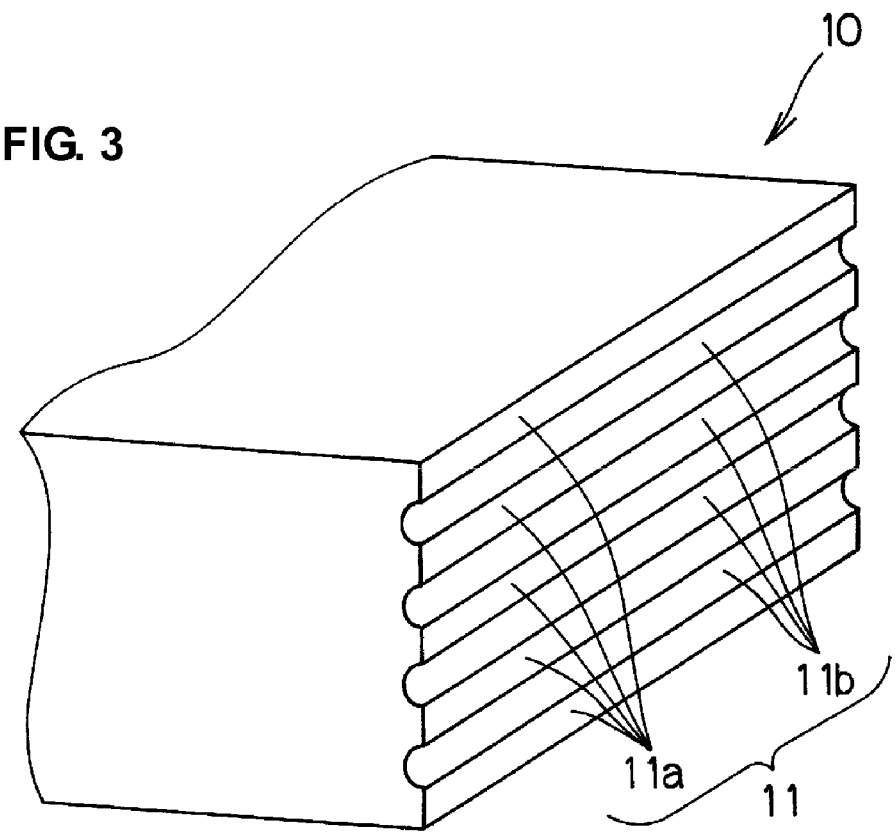
FIG. 3 is a perspective view of an edge of a multilayer ceramic substrate according to the preferred embodiment shown in FIG. 1.

As shown in FIG. 3, cavity-separation portions 11b formed by dividing the cavities 18a and 18b and having a concave shape and substantially flat ceramic-layer-break portions 11a formed by breakage of the ceramic layers are exposed at edges 11 of each of the pieces 10a, 10b, and 10c. For ceramic grains defining the ceramic layers, only grain boundary failure occurs at the cavity-separation portions 11b. Grain boundary failure and intragranular failure occur at the ceramic-layer-break portions 11a.

To promote the initiation of separation, one or more grooves may be formed in either or both main surfaces of the green ceramic laminate 12a.

An example of the production of the multilayer ceramic substrates will be described below.

Ceramic green sheets including ceramic materials are prepared.

Specifically, the ceramic green sheets are produced as follows: A mixture of about 50 to about 65 percent by weight of a glass powder having a composition of CaO (10% to 55%), $SiO_2$ (45% to 70%), $Al_2O_3$ (0% to 30% by weight), impurities (0% to 10% by weight), and $B_2O_3$ (0% to 20% by weight) and about 35 to about 50 percent by weight of an $Al_2O_3$ powder containing 0% to 10% by weight impurities is dispersed in an organic vehicle including an organic solvent, a plasticizer, and other suitable substances to prepare a slurry. The resulting slurry is formed into sheets by a doctor blade method or casting, for example. Thereby, green glass ceramic layers (ceramic green sheets) are produced.

The green glass ceramic layers (ceramic green sheets) are preferably ceramic green sheets formed by the above-described sheet-forming method. Alternatively, the green glass ceramic layers may be green thick printed layers. With respect to the ceramic powder, a magnetic material, such as ferrite, and a dielectric material, such as barium titanate, may be used in addition to the above-described insulating material. Low-temperature co-fired ceramic green sheets that are sintered at about 1,050° C. or less are preferred. Thus, the above-described glass powder has a softening point of about 750° C. or less.

Vias are formed in the green glass ceramic layers by punching or other suitable method. Examples of methods for forming the in-plane conductive patterns 14 include a method in which a conductive paste is applied by screen printing, gravure printing, or other suitable method, and a method in which metal foil having a predetermined shape is transferred onto the green glass ceramic layers.

A material primarily composed of Ag having low resistivity and oxidation resistance is preferably used for the conductive material. In particular, when a greater bond strength to a ceramic material is required, at least one additive, such as $Al_2O_3$, may be included in addition to Ag as the primary component.

The conductive paste may be produced by adding a predetermined proportion of an organic vehicle to the above-described the main component powder, and stirring and kneading the mixture. However, the sequence of mixing the main component powder, the additive powder, and the organic vehicle is not particularly limited.

The organic vehicle is a mixture of a binder resin and a solvent. Examples of binder resins that may be used include ethyl cellulose, acrylic resins, polyvinyl butyral, and methacrylic resins.

Examples of solvents that may be used include terpineol, dihydroterpineol, dihydroterpineol acetate, butyl carbitol, butyl carbitol acetate, and alcohols.

As required, various dispersants, plasticizers, and activators may also be included.

The conductive paste preferably has a viscosity of about 50 Pa·s to about 700 Pa·s, for example, in view of printability.

The conductive patterns arranged on the surface include portions at which the conductive via patterns 15 for connection of conductive patterns arranged at different interfaces among the layers are exposed at the surface. The conductive via patterns 15 are formed by filling the above-described paste by printing or other suitable method into the through holes formed in the glass ceramic green sheets by punching or other suitable method.

In addition to the paste for forming the in-plane conductive patterns 14, a paste for forming the boundary-defining conductive patterns 16 is formed and applied by printing. Preferably, the Ag powder of the paste does not contain coarse particles and extremely aggregated particles. The conductive paste preferably has a maximum particle size of about 5 µm or less, for example.

The shrinkage inhibiting green sheets are produced as follows: A powder of a ceramic material, such as alumina, which is not substantially sintered at a firing temperature of the above-described green glass ceramic layers (ceramic green sheets) is dispersed in an organic vehicle including an organic binder, an organic solvent, a plasticizer, and other suitable substances to prepare a slurry. The resulting slurry is formed into sheets by a doctor blade method or casting, for example. Thereby, the shrinkage inhibiting green sheets are produced. The shrinkage inhibiting green sheets are sintered at, for example, about 1,400° C. to about 1,600° C., and thus, are not substantially sintered at the firing temperature of the green glass ceramic layers (ceramic green sheets).

Each of the shrinkage inhibiting green sheets may have a single-layer structure or a structure including a plurality of stacked layers. The ceramic powder used for the shrinkage inhibiting green sheets preferably has an average particle size of about 0.1 µm to about 5.0 µm. In the case of the ceramic powder having an average particle size of less than about 0.1 µm, the powder reacts vigorously with the glass components contained in the vicinity of surfaces of the green glass ceramic layers. Thus, in some cases, the glass ceramic layers are bonded to the shrinkage inhibiting green sheets after firing. As a result, the shrinkage inhibiting green sheets cannot be removed. Furthermore, delamination may occur in the substrate because the organic components, such as the binder, in the sheets are not easily eliminated due to such a small particle size. On the other hand, the ceramic powder having an average particle size greater than about 5.0 µm tends to be less effective in inhibiting firing shrinkage, thereby causing the substrate to shrink in the x and y directions or to warp.

The ceramic powder in the shrinkage inhibiting green sheets may be a ceramic powder that is not substantially sintered at the firing temperature of the green glass ceramic layers. Ceramic powders, such as zirconia and magnesia, may be used in addition to alumina. However, in order to increase the amount of the glass components in surface regions of the green glass ceramic layers, the glass components in the surface regions must have good wettability for the shrinkage inhibiting green sheets at interfaces at which the surfaces are in contact with the shrinkage inhibiting green sheets. Thus, the same ceramic powder as the ceramic powder in the green glass ceramic layers is preferred.

The ceramic green sheets including the in-plane conductive patterns, the conductive via patterns, and the boundary-defining conductive patterns are stacked to form a green ceramic laminate. A composite laminate including the shrinkage inhibiting green sheets arranged on both main surfaces of the ceramic laminate is produced by superposing the shrinkage inhibiting green sheets on one main surface and the other main surface of the green ceramic laminate and press-bonding the resulting article by isostatic pressing at a pressure of, for example, about 5 MPa to about 200 MPa.

Preferably, each of the shrinkage inhibiting green sheets has a thickness of about 25 µm to about 500 µm. Shrinkage inhibiting green sheets having a thickness of less than about 25 µm are less effective at inhibiting firing shrinkage, thereby allowing the substrate to shrink in the x and y directions or to warp. At a thickness greater than about 500 µm, delamination tends to occur in the substrate because the organic components, such as the binder, in the sheets are not easily eliminated.

The composite laminate is fired with a known belt furnace or a batch furnace at a firing temperature, e.g., about 850° C. to about 950° C., of the ceramic green sheets of the ceramic laminate to sinter the ceramic laminate. In this case, the green ceramic laminate shrinks significantly in the thickness direction but does not substantially shrink in the planar direction due to the shrinkage inhibiting green sheets.

The shrinkage inhibiting green sheets are removed from the composite laminate after firing to obtain the sintered ceramic laminate including portions to be formed into the plurality of multilayer ceramic substrates.

In the sintered composite laminate, the shrinkage inhibiting green sheets are not substantially sintered. The organic components included therein before firing are eliminated. As a result, the shrinkage inhibiting green sheets become porous. Thus, the shrinkage inhibiting green sheets can be easily removed by sand blasting, wet blasting, a supersonic vibration technique, or other suitable method.

The ceramic laminate obtained by removing the shrinkage inhibiting green sheets is divided along the boundaries of the multilayer ceramic substrates into the pieces of the multilayer ceramic substrates.

When the ceramic laminate is divided after firing, stress concentration occurs in the vicinity of the cavities formed along the boundaries between the multilayer ceramic substrates to form cracks. Thereby, each multilayer ceramic substrate has the desired dimensions and smooth edges. The edges may be further smoothed by a smoothing process, such as barrel polishing.

Figure 4:
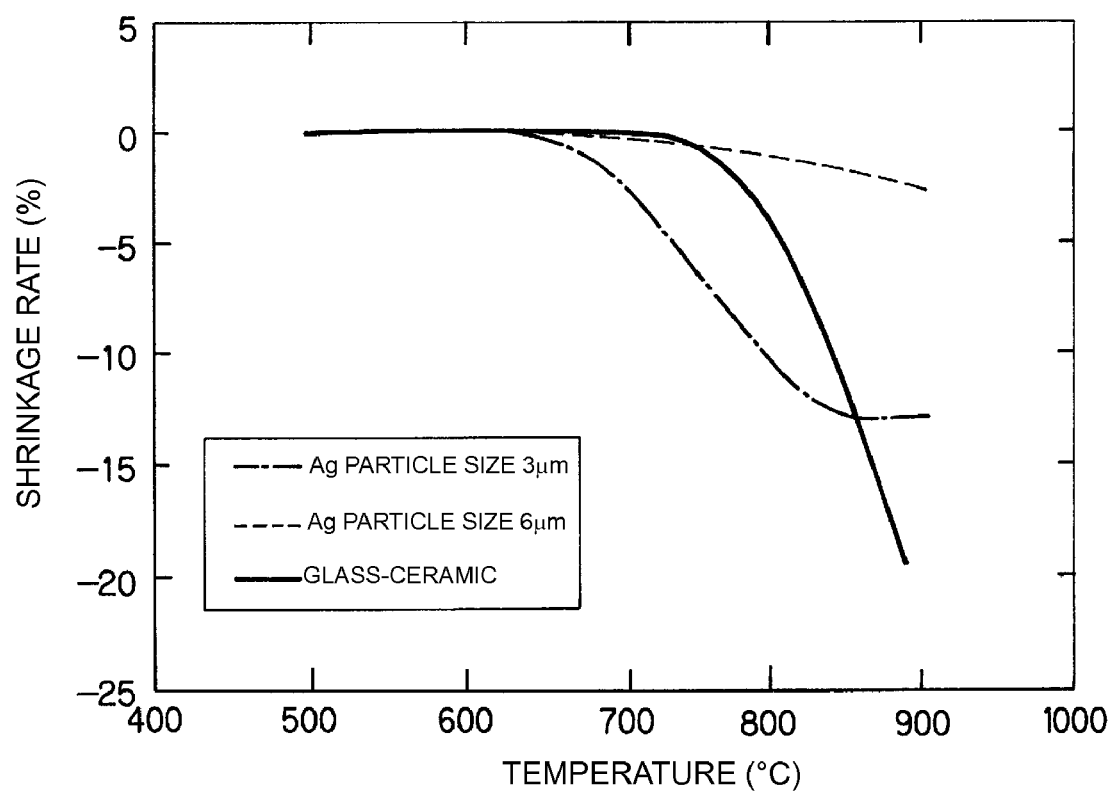
FIG. 4 is a graph showing shrinkage rates according to the preferred embodiment shown in FIG. 1.

FIG. 4 is a graph showing the TMA measurement results of the Ag pastes used to form the boundary-defining conductive patterns and a glass-ceramic base material used to form the ceramic green sheets. The graph clearly shows significant differences in the shrinkage timing and the shrinkage rates.

The shrinkage curve, indicated by a solid line, of the glass-ceramic base material is between the Ag pastes having Ag particle sizes of about 3 µm and about 6 µm. The Ag paste having a particle size of about 3 µm, indicated by a two-dot chain line, has a shrinkage initiation temperature that is less than that of the glass-ceramic base material indicated by the solid line and a shrinkage rate that is greater than that of the Ag paste having a particle size of about 6 µm.

When the Ag paste having a particle size of about 3 µm is used to form the boundary-defining conductive patterns, cavities are formed in the vicinity of interfaces among the boundary-defining conductive patterns and the ceramic layers after firing. On the other hand, when the Ag paste having a particle size of about 6 μm is used to form the boundary-defining conductive patterns, cavities are not formed in the vicinity of interfaces among the boundary-defining conductive patterns and the ceramic layers after firing. Accordingly, the results demonstrate that the Ag paste used to form the boundary-defining conductive patterns preferably has a particle size of about 4 μm to about 5 μm.

The shrinkage behavior of the Ag paste varies not only depending on the Ag particle size but also, for example, the Ag content of the paste and the impurity content other than Ag. Specifically, the paste may have an Ag content of about 85 percent by weight or less. The paste may include about 0.5 percent by weight or more of $Al_2O_3$ as an impurity.

The presence and size of the cavities formed at the edges of each boundary-defining conductive pattern can be controlled by utilizing differences between the boundary-defining thick-film patterns and the ceramic green sheets of the shrinkage initiation temperature, the shrinkage termination temperature, and the shrinkage rate. For example, the presence and size of the cavities formed at the edges of each boundary-defining conductive pattern can be controlled by appropriately selecting the Ag particle size, the particle-size distribution, the shape (sphere, flat, etc.), and the specific surface area in the Ag paste used to form the boundary-defining conductive patterns. The presence and size of the cavities formed at the edges of each boundary-defining conductive pattern can also be controlled by appropriately selecting the particle size, the particle-size distribution, the shape, the specific surface area, and the material, of an additive, the presence of a coating (surface state of Ag), a binder, a solvent, and other substances.

Second Preferred Embodiment

Figure 5:
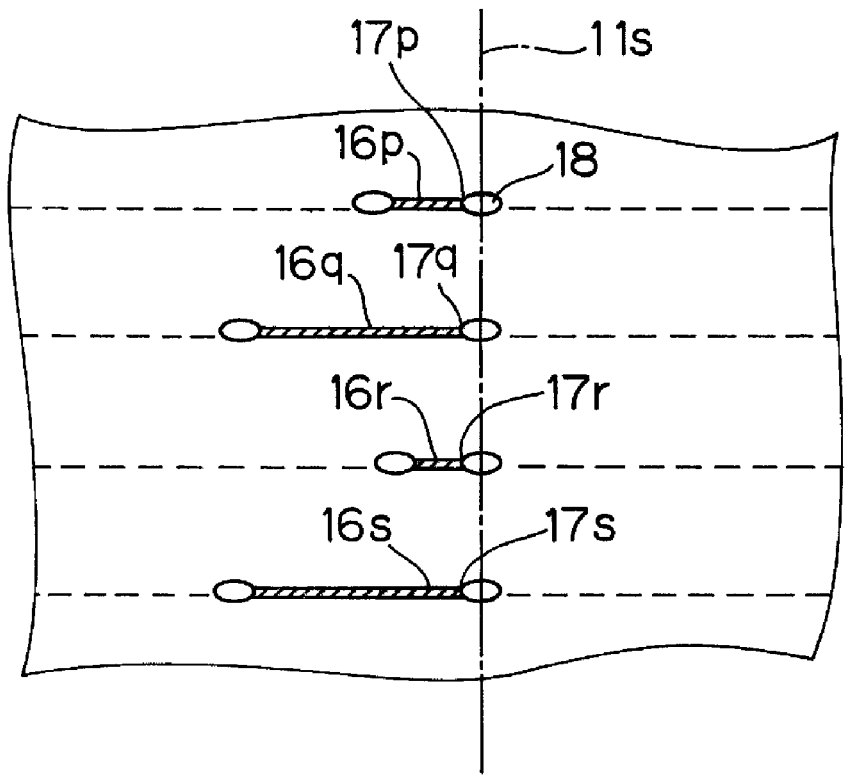
FIG. 5 is a cross-sectional view of a multilayer ceramic substrate according to another preferred embodiment of the present invention.

The ceramic laminate is separated at an edge through one of the cavities formed at both edges of each boundary-defining conductive pattern. To form the edge more accurately, as shown in FIG. 5, the locations and widths of the boundary-defining conductive patterns 16p, 16q, 16r, and 16s may be changed such that sides 17p, 17q, 17r, and 17s of individual boundary-defining conductive patterns 16p, 16q, 16r, and 16s are aligned along the boundaries of the multilayer ceramic substrates. Thereby, the ceramic laminate after firing can be separated at edge 11s passing through the cavities 18 formed at the sides 17p, 17q, 17r, and 17s aligned in the stacking direction of the boundary-defining conductive patterns 16p, 16q, 16r, and 16s.

The boundary-defining conductive patterns may also be arranged on both sides of the break edge. Alternatively, the boundary-defining conductive patterns may overlap the in-plane conductive patterns.

Third Preferred Embodiment

Figure 6:
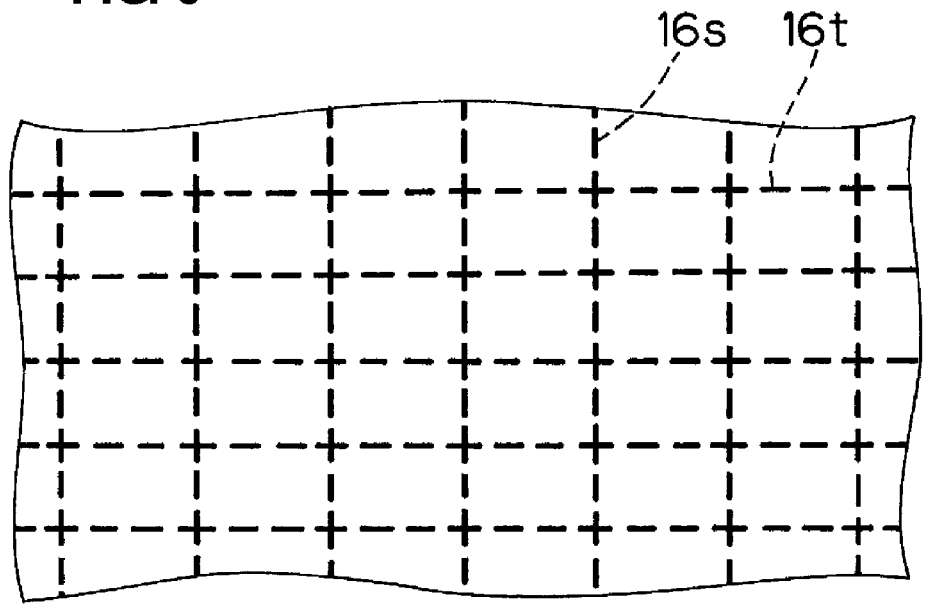
FIG. 6 is a plan view of a boundary-defining conductive pattern according to another preferred embodiment of the present invention.

As shown in FIG. 6, boundary-defining conductive pattern segments 16s and 16t may be discontinuously formed.

Fourth Preferred Embodiment

The boundary-defining conductive patterns may be formed along only a portion of the boundaries. For example, the boundary-defining conductive patterns may be formed only longitudinally or only laterally. In this case, the source substrate can be separated into strips.

Fifth Preferred Embodiment

As shown in FIGS. 7A-7D, the boundary-defining conductive patterns may be formed to also function as the in-plane conductive patterns defining the internal electrodes, leads, embedded elements, and other circuit elements.

Figure 7A:
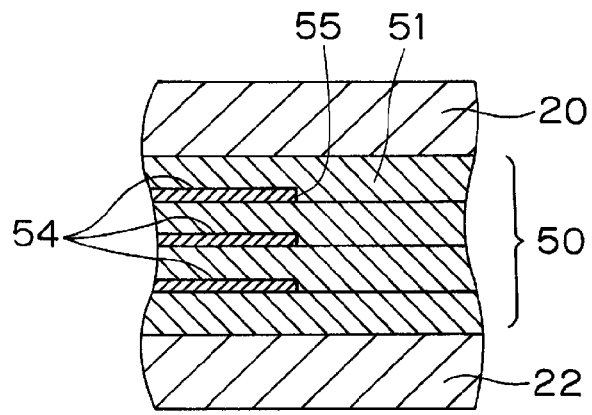
FIGS. 7A to 7D are cross-sectional views illustrating a production process of multilayer ceramic substrates according to another preferred embodiment of the present invention.

In this case, as shown in FIG. 7A, a green ceramic laminate 50 is formed such that individual sides 55 of in-plane conductive patterns 54 (e.g., internal electrodes of a capacitor) arranged between ceramic green sheets 51 are aligned along boundaries of multilayer ceramic substrates. The in-plane conductive patterns 54 are composed of a material having firing shrinkage characteristics that are different those of the ceramic green sheets 51, as in the first preferred embodiment. The shrinkage inhibiting green sheets 20 and 22 are in close contact with both surfaces of the green ceramic laminate 50, as in the first preferred embodiment.

Figure 7B:
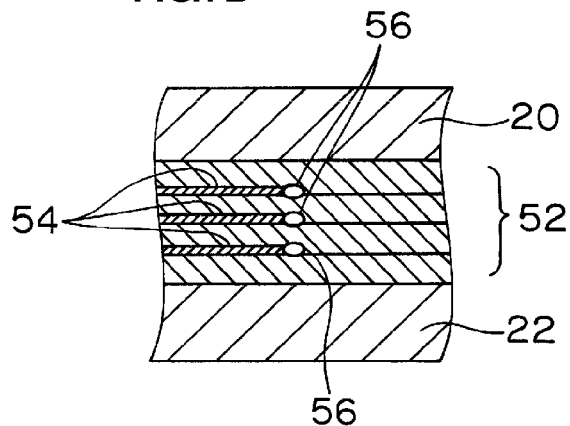

Firing is performed at a temperature at which the ceramic green sheets 51 are sintered and at which the shrinkage inhibiting green sheets 20 and 22 are not substantially sintered. Thereby, as shown in FIG. 7B, cavities 56 are formed in the sintered ceramic laminate 52 and are adjacent to the aligned sides 55 of the in-plane conductive patterns 54.

Figure 7C:
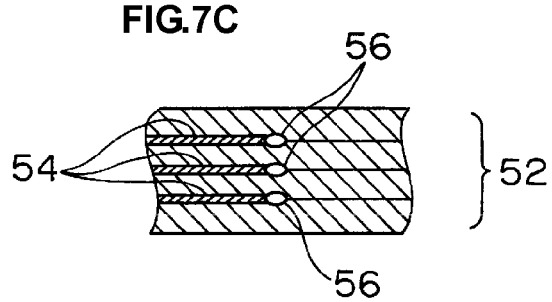

As shown in FIG. 7C, the shrinkage inhibiting green sheets 20 and 22 are removed to obtain the sintered ceramic laminate 52 (source substrate).

Figure 7D:
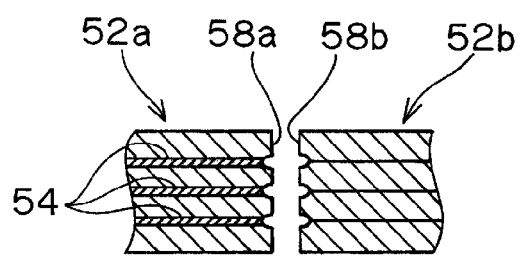

As shown in FIG. 7D, the sintered ceramic laminate 52 (source substrate) is separated by bending into portions 52a and 52b having edges 58a and 58b passing through the cavities 56. External electrodes may be formed so as to be connected to end faces of the in-plane conductive patterns exposed at edges 58a and 58b. When the external electrodes are not required, an insulating protective film may be formed on the edges 58a and 58b.

As described above, when the boundary-defining conductive patterns formed on the ceramic green sheets have sintering shrinkage characteristics that are different from that of the ceramic green sheets during firing, the cavities adjacent to edges of the boundary-defining conductive patterns in the ceramic laminate are formed after firing. The cavities can be formed in the multilayer ceramic substrate without forming a groove or cavity in the ceramic green sheets before firing and without forming a separation groove in the ceramic laminate after firing. When the boundary-defining conductive patterns are formed on the front or back surface of the multilayer ceramic substrate, grooves are formed on the front or back surface of the multilayer ceramic substrate and are adjacent to edges of the boundary-defining conductive patterns.

When the source substrate is bent, cracks passing are formed through the cavities or grooves at which the cross sectional thickness is reduced, thus forming the edges passing through the cavities or grooves. Therefore, the source substrate can be divided accurately and easily into individual substrates. Thus, many circuit boards can be obtained from the single substrate.

The boundary-defining conductive patterns may be formed on the ceramic green sheets in a step of forming the conductive patterns. Thus, a groove or a cavity is not required to be formed in the ceramic green sheets before firing or the ceramic laminate before firing. After firing, the ceramic laminate can be separated by bending. Thus, additional processing of the ceramic laminate with a special cutting apparatus for cutting the hard ceramic laminate after firing (e.g., a laser beam machine and a dicing saw) is eliminated, thereby simplifying the process.

Also, when the number of stacked ceramic layers is increased, edges of the multilayer ceramic substrate can be accurately formed by aligning the cavities in the stacking direction. Therefore, the multilayer ceramic substrate can be accurately and easily produced with high dimensional accuracy.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for producing a multilayer ceramic substrate, comprising:
    a first step of forming a green ceramic laminate including a plurality of stacked green ceramic layers;
    a second step of firing the green ceramic laminate to sinter the green ceramic layers; and
    a third step of dividing the sintered ceramic laminate formed by firing the green ceramic laminate into a plurality of pieces; wherein
    the green ceramic laminate formed in the first step includes at least one green boundary-defining thick-film pattern arranged on a main surface of at least one of the green ceramic layers and along a portion corresponding to the boundary between the pieces of the sintered ceramic laminate divided in the third step;
    the at least one green boundary-defining thick-film pattern has firing shrinkage characteristics that are different from those of the green ceramic layers adjacent to the at least one green boundary-defining thick-film pattern;
    in the second step, at least one cavity is formed due to the differences in firing shrinkage characteristics between the at least one boundary-defining thick-film pattern and the ceramic layers in contact with the at least one boundary-defining thick-film pattern;
    the at least one cavity is formed along an edge of the at least one boundary-defining thick-film pattern when viewed in the stacking direction of the ceramic layers during sintering of the green ceramic laminate in the second step as a result of the different shrinkage characteristics between the at least one boundary-defining thick-film pattern and the ceramic layers;
    in the third step, the sintered ceramic laminate is divided along the cavity into the plurality of pieces; and
    the at least one green boundary-defining thick-film pattern is arranged only along the boundary between the pieces of the sintered ceramic laminate divided in the third step.

2. The method for producing a multilayer ceramic substrate according to claim 1, wherein the firing shrinkage initiation temperature of the at least one green boundary-defining thick-film pattern is less than that of the green ceramic layers in contact with the boundary-defining thick-film pattern.

3. The method for producing a multilayer ceramic substrate according to claim 1, wherein the firing shrinkage rate of the at least one green boundary-defining thick-film pattern is greater than that of the ceramic layers in contact with the at least one boundary-defining thick-film pattern.

4. The method for producing a multilayer ceramic substrate according to claim 1, wherein the at least one boundary-defining thick-film pattern comprises a plurality of boundary-defining thick-film patterns, the plurality of boundary-defining thick-film patterns are arranged at different interfaces between the green ceramic layers, and at least a portion of an outer edge of each of the plurality of boundary-defining thick-film patterns is arranged in a common imaginary plane extending in the stacking direction of the green ceramic layers.

5. The method for producing a multilayer ceramic substrate according to claim 1, wherein
    the first step includes a substep of arranging a green shrinkage inhibiting layer that is not substantially sintered at a firing temperature of the green ceramic layers in close contact with at least one main surface of the green ceramic laminate;
    in the second step, the green ceramic laminate in close contact with the shrinkage inhibiting layer is fired at a temperature in the range of a sintering temperature of the ceramic layers to a temperature at which the shrinkage inhibiting layer is not substantially sintered; and
    the method further comprises a step of removing the shrinkage inhibiting layer in close contact with the sintered ceramic laminate between the second step and the third step.

6. The method for producing a multilayer ceramic substrate according to claim 1, wherein the at least one green boundary-defining thick-film pattern is a green boundary-defining conductive pattern including a conductive material.

7. The method for producing a multilayer ceramic substrate according to claim 6, wherein
    the sintered ceramic laminate includes an internal circuit conductive pattern defining an embedded element arranged between the ceramic layers; and
    the internal circuit conductive pattern is electrically separated from the boundary-defining conductive pattern.

8. The method for producing a multilayer ceramic substrate according to claim 6, wherein at least a portion of the boundary-defining conductive pattern defines an embedded element arranged between the ceramic layers of the sintered ceramic laminate.

9. The method for producing a multilayer ceramic substrate according to claim 1, further comprising a step of mounting a surface-mounted electronic component on the sintered ceramic laminate before or after the sintered ceramic laminate is divided into the plurality of pieces.

10. A sintered source substrate of multilayer ceramic substrates, comprising:
    a plurality of ceramic layers bonded to each other;
    at least one boundary-defining conductive pattern arranged at least one interface among the ceramic layers;
    portions to be formed into a plurality of multilayer ceramic substrates; and
    an internal circuit conductive pattern defining an embedded element arranged between the ceramic layers; wherein
    when the source substrate is viewed in a stacking direction of the ceramic layers, a cavity is provided only along a boundary of the multilayer ceramic substrates, and the cavity is provided along an edge of the at least one boundary-defining conductive pattern; and
    each of the at least one boundary-defining conductive pattern is electrically separated from all portions of the internal circuit conductive pattern.

* * * * *